(12) United States Patent
Tsukamoto et al.

(10) Patent No.: US 11,217,763 B2
(45) Date of Patent: Jan. 4, 2022

(54) LIGHT-EMITTING DEVICE INCLUDING LIGHT-EMITTING LAYER IN WHICH THERMALLY ACTIVATED DELAYED FLUORESCENCE BODIES AND QUANTUM DOTS ARE DISPERSED AND MANUFACTURING APPARATUS OF LIGHT-EMITTING DEVICE

(71) Applicant: SHARP KABUSHIKI KAISHA, Sakai (JP)

(72) Inventors: Yuto Tsukamoto, Sakai (JP); Shinichi Kawato, Sakai (JP); Tokiyoshi Umeda, Sakai (JP); Manabu Niboshi, Sakai (JP); Youhei Nakanishi, Sakai (JP); Hisayuki Utsumi, Sakai (JP); Masayuki Kanehiro, Sakai (JP); Shota Okamoto, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 31 days.

(21) Appl. No.: 16/644,057

(22) PCT Filed: Sep. 5, 2017

(86) PCT No.: PCT/JP2017/031893
§ 371 (c)(1),
(2) Date: Mar. 3, 2020

(87) PCT Pub. No.: WO2019/049190
PCT Pub. Date: Mar. 14, 2019

(65) Prior Publication Data
US 2021/0066630 A1 Mar. 4, 2021

(51) Int. Cl.
*H01L 29/18* (2006.01)
*H01L 51/50* (2006.01)
(Continued)

(52) U.S. Cl.
CPC ........ *H01L 51/502* (2013.01); *H01L 27/3211* (2013.01); *H01L 51/56* (2013.01)

(58) Field of Classification Search
CPC . H01L 51/502; H01L 27/3211; H01L 51/5012
See application file for complete search history.

(56) References Cited

U.S. PATENT DOCUMENTS

2010/0237322 A1* 9/2010 Okada ................ H05B 33/145
257/13
2012/0206035 A1 8/2012 Shitagaki et al.
(Continued)

FOREIGN PATENT DOCUMENTS

CN 105870347 A 8/2016
JP 2012-186460 A 9/2012
(Continued)

*Primary Examiner* — Caleb E Henry
(74) *Attorney, Agent, or Firm* — ScienBiziP, P.C.

(57) ABSTRACT

To provide a light-emitting device that can obtain fluorescence having a narrow spectrum more efficiently, a light-emitting device includes: a light-emitting layer in which thermally activated delayed fluorescence bodies and quantum dots are dispersed; a first electrode in a lower layer than the light-emitting layer; and a second electrode in an upper layer than the light-emitting layer, wherein a light emission spectrum of the thermally activated delayed fluorescence bodies and an absorption spectrum of the quantum dots at least partially overlap each other.

10 Claims, 8 Drawing Sheets

(51) Int. Cl.
  *H01L 27/32* (2006.01)
  *H01L 51/56* (2006.01)

(56) References Cited

U.S. PATENT DOCUMENTS

| | | |
|---|---|---|
| 2014/0034930 A1 | 2/2014 | Seo et al. |
| 2015/0333102 A1* | 11/2015 | Sato ................ H01L 27/156 257/13 |
| 2015/0340638 A1 | 11/2015 | Shitagaki et al. |
| 2016/0172605 A1 | 6/2016 | Seo et al. |
| 2017/0047537 A1 | 2/2017 | Shitagaki et al. |
| 2017/0062749 A1* | 3/2017 | Seo ................ H01L 51/502 |
| 2017/0084844 A1* | 3/2017 | Parham ............ C07D 209/82 |
| 2017/0133617 A1 | 5/2017 | Seo et al. |
| 2017/0186986 A1* | 6/2017 | Lee ................ H01L 51/502 |
| 2017/0186988 A1* | 6/2017 | Kim ............... H01L 51/5072 |
| 2017/0342319 A1* | 11/2017 | Li ................. C08F 283/00 |
| 2018/0053907 A1* | 2/2018 | He ................. H01L 51/502 |
| 2018/0226600 A1 | 8/2018 | Seo et al. |
| 2018/0351125 A1 | 12/2018 | He et al. |
| 2019/0067615 A1 | 2/2019 | Seo et al. |
| 2019/0189949 A1 | 6/2019 | Shitagaki et al. |
| 2019/0267564 A1 | 8/2019 | Seo et al. |

FOREIGN PATENT DOCUMENTS

| | | |
|---|---|---|
| JP | 2014-045179 A | 3/2014 |
| JP | 2015-220069 A | 12/2015 |
| JP | 2017-509165 A | 3/2017 |

\* cited by examiner

LIGHT-EMITTING DEVICE INCLUDING LIGHT-EMITTING LAYER IN WHICH THERMALLY ACTIVATED DELAYED FLUORESCENCE BODIES AND QUANTUM DOTS ARE DISPERSED AND MANUFACTURING APPARATUS OF LIGHT-EMITTING DEVICE

TECHNICAL FIELD

The present invention relates to a light-emitting device including a light-emitting element including quantum dots and a manufacturing apparatus of the light-emitting dev ice.

BACKGROUND ART

PTL 1 describes a light-emitting element provided with a light-emitting layer in which a material that emits thermally activated delayed fluorescence (TADF) and a material that emits fluorescence is mixed to improve luminous efficiency.

In the light-emitting element of PTL 1, a singlet excitation state of the TADF material is created from a triplet excitation state of the TADF material by reverse intersystem crossing. Then, the singlet excitation state of the TADF material transitions to the singlet excitation state of the fluorescent material by the Förster transition to generate fluorescence.

CITATION LIST

Patent Literature

PTL 1: JP 2014-45179 A (published on Mar. 13, 2014).

SUMMARY OF INVENTION

Technical Problem

A light emission spectrum of the fluorescent material is relatively broad compared to that of an LED and the like. Therefore, in the light-emitting element described in PTL 1, it is difficult to obtain light emission with deep chromaticity compared to a conventional LED or the like.

In order to achieve deep chromaticity, there are techniques that employ a light emission material including quantum dots with a narrow light emission spectrum and create excitons in the quantum dots to obtain light emission. However, as the concentration of the quantum dots in the light emission material increases, the luminous efficiency decreases due to concentration reduction, so the concentration of the quantum dots in the light emission material needs to be low. In a case that the concentration of the quantum dots in the light emission material is low, excitons are generated in the dispersing material in the light emission material, and non-light emission radiation is generated, so the luminous efficiency decreases.

Solution to Problem

To solve the above-mentioned problems, a light-emitting device according to the present invention includes: a light-emitting, layer in which thermally activated delayed fluorescence bodies and quantum dots are dispersed; a first electrode in a lower layer than the light-emitting layer; and a second electrode in an upper layer than the light-emitting layer, wherein a light emission spectrum of the thermally activated delayed fluorescence bodies and an absorption spectrum of the quantum dots at least partially overlap each other.

Advantageous Effects of Invention

With the above configuration, light emission can be obtained from quantum dots having a narrow light emission spectrum, and a light-emitting device can be obtained with improved efficiency of the light emission.

DESCRIPTION OF EMBODIMENTS

First Embodiment

In the present specification, the direction from the light-emitting layer to the first electrode of the light-emitting device is referred to as "lower direction", and the direction from the light-emitting layer to the second electrode of the light-emitting device is referred to as "upper direction".

Figure 1:
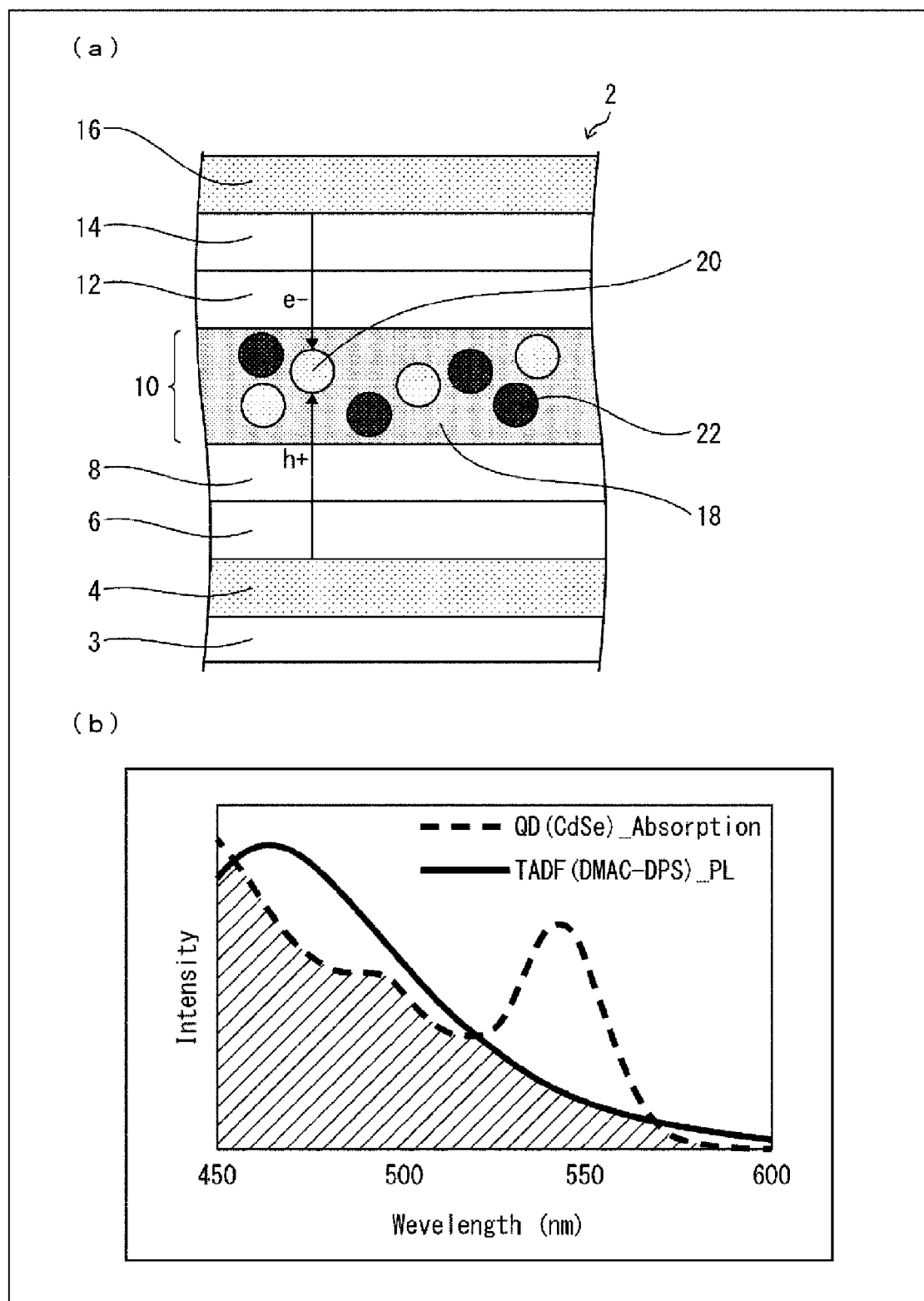
FIG. 1 is a schematic cross-sectional view of a light-emitting device according to a first embodiment of the present invention, and is a diagram illustrating examples of a light emission spectrum of thermally activated delayed fluorescence bodies of the light-emitting device and an absorption spectrum of quantum dots of the light-emitting device.

(a) of FIG. 1 is a schematic cross-sectional view of a light-emitting device 2 according to the present embodiment.

As illustrated in (a) of FIG. 1, the light-emitting device 2 has a structure in which layers are stacked on an array substrate 3 including, a Thin Film Transistor (TFT) not illustrated. A first electrode 4 formed in the upper layer of the array substrate 3 is electrically connected with the TFT of the array substrate 3. The light-emitting device 2 includes, on the first electrode 4, a hole injection layer 6, a hole transport layer 8, a light-emitting layer 10, an electron transport layer 12, an electron injection layer 14, and a second electrode 16 in this order from the lower layer. In the present embodiment, the first electrode 4 is an anode and the second electrode 16 is a cathode.

The light-emitting layer 10 includes a host 18, thermally activated delayed fluorescence (TAF) bodies 20, and quantum dots (semiconductor nanoparticles) 22. The thermally activated delayed fluorescence bodies 20 and quantum dots 22 are dispersed in the host 18.

The host 18 includes a compound having a function of injecting and transporting holes and electrons. The host 18 may include a photosensitive material. The host 18 may further include a dispersing material not illustrated.

In the light-emitting device 2, when a potential difference is applied between the first electrode 4 and the second electrode 16, holes and electrons are injected into the light-emitting layer 10 from the first electrode 4 and the second electrode 16, respectively. As illustrated in (a) of FIG. 1, a hole from the first electrode 4 reaches the light-emitting layer 10 through the hole injection layer 6 and the hole transport layer 8. An electron from the second electrode 16 reaches the light-emitting layer 10 through the electron injection layer 14 and the electron transport layer 12.

The hole and electron having reached the light-emitting layer 10 are recombined in the quantum dots 22 through the host 18, and an exciton is generated. The hole transport properties of the hole injection layer 6 and the hole transport layer 8 and the electron transport properties of the electron injection layer 14 and the electron transport layer 12 are adjusted such that excitons are generated in the light-emitting layer 10 as described above.

The thermally activated delayed fluorescence bodies 20 include the ground level, the singlet excitation level, and the triplet excitation level. When energy is applied to the thermally activated delayed fluorescence bodies 20 from the exciton generated by a recombination of the hole and the electron, the exciton is excited from the ground level to, the triplet excitation level of the thermally activated delayed fluorescence bodies 20. Here, the thermally activated delayed fluorescence bodies 20 are capable of transitioning above the excitons from the triplet excitation level to the singlet excitation level by reverse intersystem crossing. As the excitons transition from the singlet excitation level to the ground level of the thermally activated delayed fluorescence bodies 20, the thermally activated delayed fluorescence bodies 20 emit fluorescence. Therefore, the thermally activated delayed fluorescence bodies 20 are capable of converting some of the energy of the excitons in the triplet excitation level into fluorescence energy.

From the above, the thermally activated delayed fluorescence bodies 20 are materials having the difference between the triplet excitation level and the singlet excitation level being small enough to be capable of intersystem crossing due to ambient thermal energy or the like. Specifically, the difference between the triplet excitation level and the singlet excitation level is, for example, not greater than 0.2 eV, The thermally activated delayed fluorescence bodies 20 may be DMAC-DPS, for example.

The quantum dots 22 are fluorescent materials having a valence band level and a conduction band level, in which excitons excited from the valence band level to the conduction band level emit fluorescence in a case of transitioning to the valence band level. Since fluorescence from the quantum dots 22 has a narrower spectrum as compared to fluorescence from typical fluorescent materials, it is possible to obtain fluorescence with relatively deep chromaticity from the quantum dots 22. The quantum dots 22 may be semiconductor nanoparticles having a core-shell structure with a CdSe core and a ZnS for example.

(b) of FIG. 1 is a spectrum graph in which an example of the fluorescence spectrum of the thermally activated delayed fluorescence bodies 20 is illustrated by a solid line and an example of the absorption spectrum of the quantum dots 22 is illustrated by a broken line. The hatched area in (b) of FIG. 1 indicates an area where the fluorescence spectrum of the thermally activated delayed fluorescence bodies 20 and the absorption spectrum of the quantum dots 22 overlap. In the spectrum graphs of the present specification, the horizontal axis indicates the wavelength and the vertical axis indicates the normalized spectrum intensity. The spectrums in (b) of FIG. 1 are normalized with respect to the maximum intensity set to 1.

Figure 2:
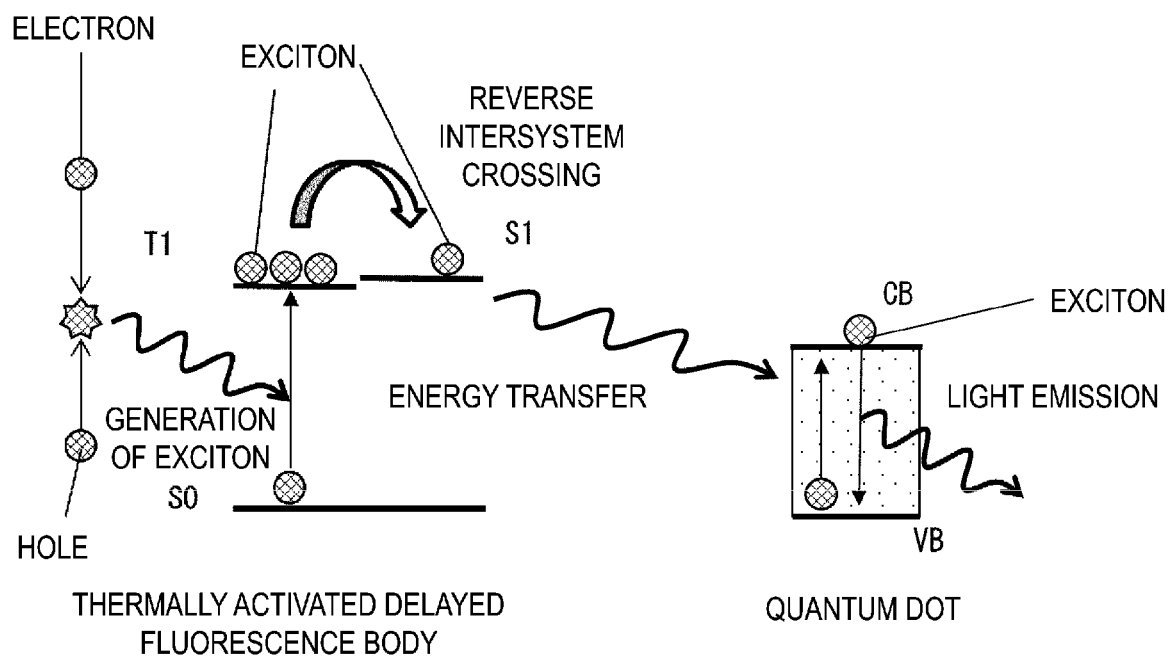
FIG. 2 is a diagram illustrating a molecular orbit diagram of thermally activated delayed fluorescence bodies and quantum dots in the light-emitting device according to the first embodiment of the present invention, and a light emission mechanism of the light-emitting device.

FIG. 2 is a diagram illustrating a light emission mechanism of the light-emitting device 2 according to the present embodiment. Left and right molecular orbit diagrams of FIG. 2 is a diagram illustrating molecular orbits of the thermally activated delayed fluorescence bodies 20 and the quantum dots 22, respectively. Note that in the molecular orbit diagram of the thermally activated delayed fluorescence bodies, S0 represents the ground level, S1 represents the singlet excitation level, and T1 represents the triplet excitation level. In the molecular orbit diagram of the quantum dots, VB represents the valence band level and CB represents the conduction band level. Note that, as illustrated in FIG. 2, in the present embodiment, the singlet excitation level of the thermally activated delayed fluorescence bodies 20 is higher than the conduction band level of the quantum dots 22. This means that the peak wavelength of the light emission spectrum of the thermally activated delayed fluorescence bodies 20 is shorter than the peak wavelength of the light emission spectrum of the quantum dots 22.

The light emission mechanism of light-emitting device 2 according to the present embodiment is described in detail with reference to FIG. 1 and FIG. 2.

As illustrated in FIG. 2, in a case where a hole and an electron having reached the light-emitting layer 10 recombine in the thermally activated delayed fluorescence bodies 20 through the host 18, an exciton is generated at the thermally activated delayed fluorescence bodies 20. The exciton is excited from the ground level to the triplet excitation level of the thermally activated delayed fluorescence bodies 20. Then, by reverse intersystem crossing, the exciton transitions from the triplet excitation level to the singlet excitation level of the thermally activated delayed fluorescence bodies 20.

Here, the exciton of the singlet excitation level of the thermally activated delayed fluorescence bodies 20 transitions to the conduction band level of the quantum dots 22 by energy transfer by the Förster mechanism. In the present embodiment, the Förster mechanism is a mechanism of energy transfer that is caused by a resonance phenomenon of dipole vibrations between the thermally activated delayed fluorescence bodies 20 and the quantum dots 22. The energy transfer by the Förster mechanism does not require direct contact between the thermally activated delayed fluorescence bodies 20 and the quantum dots 22. When the velocity constant of the Forster mechanism is represented by $k_{h^* \to g}$, $k_{h^* \to g}$ is expressed by Equation (1).

[Equation 1]

$$k_{h^* \to E} = \frac{9000c^4 K^2 \phi \ln 10}{128\pi^5 n^4 N \tau R^6} \int \frac{f'_h(v)\varepsilon_g(v)}{v^4} dv, \quad (1)$$

where ν represents the number of vibrations, $f'_h(v)$ represents a normalized fluorescence spectrum of the thermally activated delayed fluorescence bodies 20, $\varepsilon_g(v)$ represents a molar absorption coefficient of the quantum dots 22, N represents an Avogadro's number, n represents the refractive index of the host 18, R represents the intermolecular distance between the thermally activated delayed fluorescence bodies 20 and the quantum dots 22, τ represents a fluorescence lifetime of the excitation state of the thermally activated delayed fluorescence bodies 20, the fluorescence lifetime being actually measured, φ represents a fluorescence quantum yield of the thermally activated delayed fluorescence bodies 20, and K is a coefficient representing an orientation of the transition dipole moment of the thermally activated delayed fluorescence bodies 20 and the quantum dots 22. Note that, in a case of random orientation, $K^2=2/3$.

The greater the velocity constant $k_{h^* \to g}$, the more the energy transfer of the Förster mechanism becomes dominant. In view of this, the energy transfer from the thermally activated delayed fluorescence bodies 20 to the quantum dots 22 requires overlapping between the light emission spectrum of the thermally activated delayed fluorescence bodies 20 and the absorption spectrum of the quantum dots 22.

As illustrated in (b) of FIG. 1, in the present embodiment, the fluorescence spectrum of the thermally activated delayed fluorescence bodies 20 and the absorption spectrum of the quantum dots 22 at least partially overlap. With this configuration, the above-described energy transfer occurs between the thermally activated delayed fluorescence bodies 20 and the quantum dots 22 whose intermolecular distance is sufficiently small.

As illustrated in (b) of FIG. 1, in the present embodiment, the peak wavelength of the light emission spectrum of the thermally activated delayed fluorescence bodies 20 is included in the absorption spectrum of the quantum dots 22, The peak wavelength of the absorption spectrum of the quantum dots 22 is included in the light emission spectrum of the thermally activated delayed fluorescence bodies 20. With this configuration, the energy transfer described above more dominantly occurs.

Finally, in a case where an exciton transitions from the conduction band level to the valence band level of the quantum dots 22, fluorescence having energy equal to the energy difference between the conduction band level and the valence band level is emitted from the quantum dots 22. With the mechanism described above, fluorescence is obtained from the light-emitting device 2.

In the light-emitting device 2 according to the present embodiment, fluorescence is obtained from the quantum dots 22. Therefore, the light-emitting device 2 that obtains fluorescence having a narrower spectrum can be achieved compared to a light-emitting device that emits fluorescence from a typical fluorescent material.

In the present embodiment, fluorescence is generated from the quantum dots 22 by generating energy transfer of excitons from the thermally activated delayed fluorescence bodies 20 to the quantum dots 22. Therefore, compared to a case where excitons are generated directly in the quantum dots 22, a decrease in luminous efficiency due to concentration reduction is less likely to occur. Therefore, the concentration of the quantum dots 22 can be increased to a certain degree, and thus, the occurrence of non-light emission processes caused by the occurrence of excitons in the dispersing material or the like in the light-emitting layer 10 can be reduced.

The concentration of the thermally activated delayed fluorescence bodies 20 in the light-emitting layer 10 is, for example, 10 mass % to 30 mass %. In a case where the concentration of the thermally activated delayed fluorescence bodies 20 falls within the range described above, the energy transfer described above can be efficiently caused to occur. The concentration of the quantum dots 22 in the light-emitting layer is, for example, 0.1 mass % to 1 mass %. In a case where the concentration of the quantum dots 22 falls within the range described above, a decrease in luminous efficiency due to concentration reduction can be reduced, and generation of excitons in the dispersing material can be suppressed.

Second Embodiment

Figure 3:
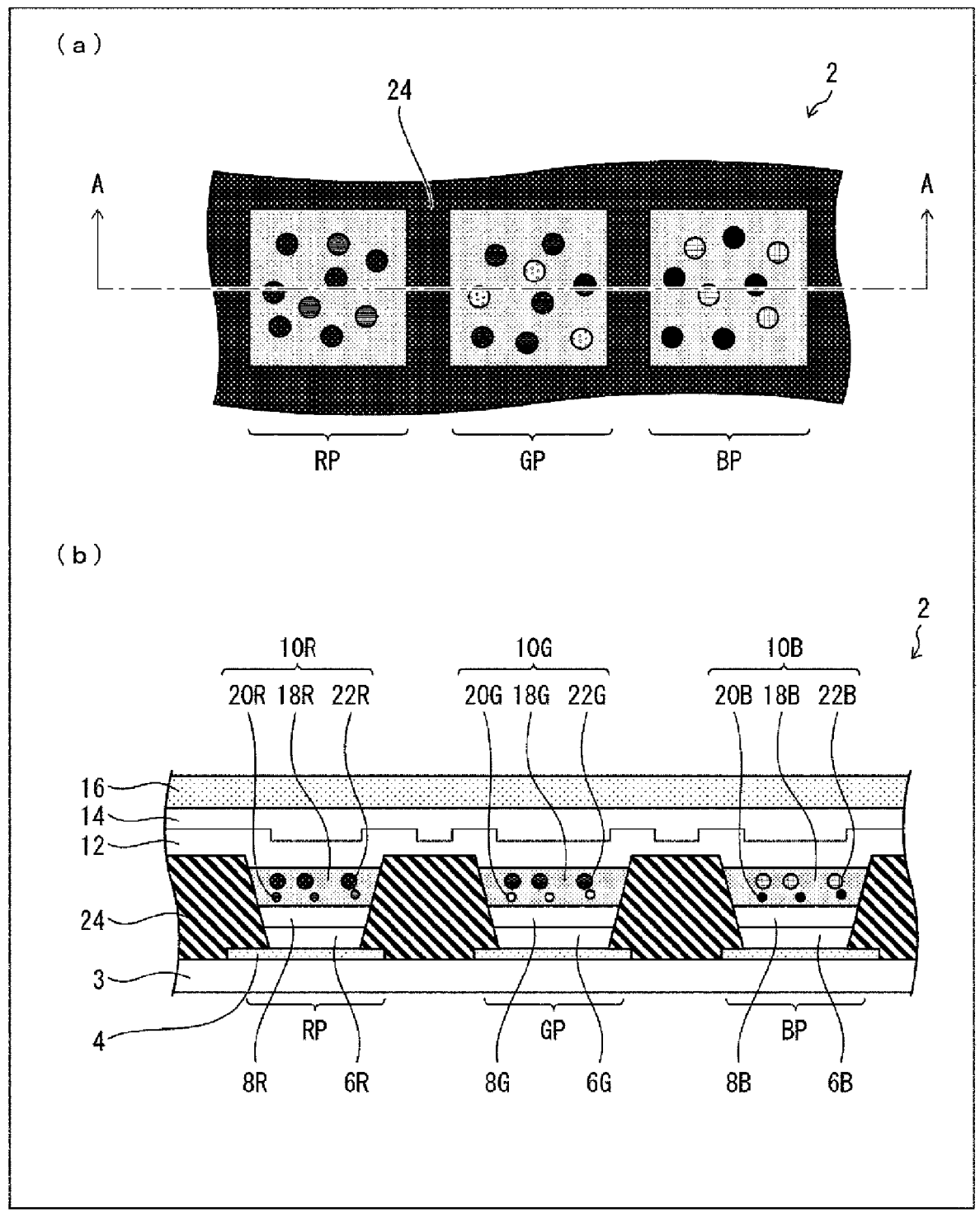
FIG. 3 is a schematic top view and a schematic cross-sectional view of a light-emitting device according to a second embodiment of the present invention.

FIG. 3 is an enlarged top view and an enlarged cross-sectional view of the light-emitting device 2 according to the present embodiment, (a) of FIG. 3 is a diagram illustrating, through the electron transport layer 12, the electron injection layer 14 and the second electrode 16, the upper face of a region around pixels of the light-emitting device 2. (b) of FIG. 3 is a cross-sectional view taken along the line A-A of (a) of FIG. 3.

In the present embodiment, the light-emitting device 2 includes a plurality of pixel areas, RP, GP and BP in comparison with the preceding embodiment. In the pixel area RP, a hole injection layer 6R, a hole transport layer 8R, and a light-emitting layer 10R are formed on the first electrode 4 in this order from the lower side. Likewise, in the pixel areas OP and BP, hole injection layers 6G and 6B, hole transport layers 8G and 8B, and light-emitting layers 10G and 10B are respectively formed in this order from the lower side. The light-emitting device 2 further includes an edge cover 24. The edge cover 24 includes a plurality of openings and defines the plurality of pixel areas RP, GP and BP.

Figure 4:
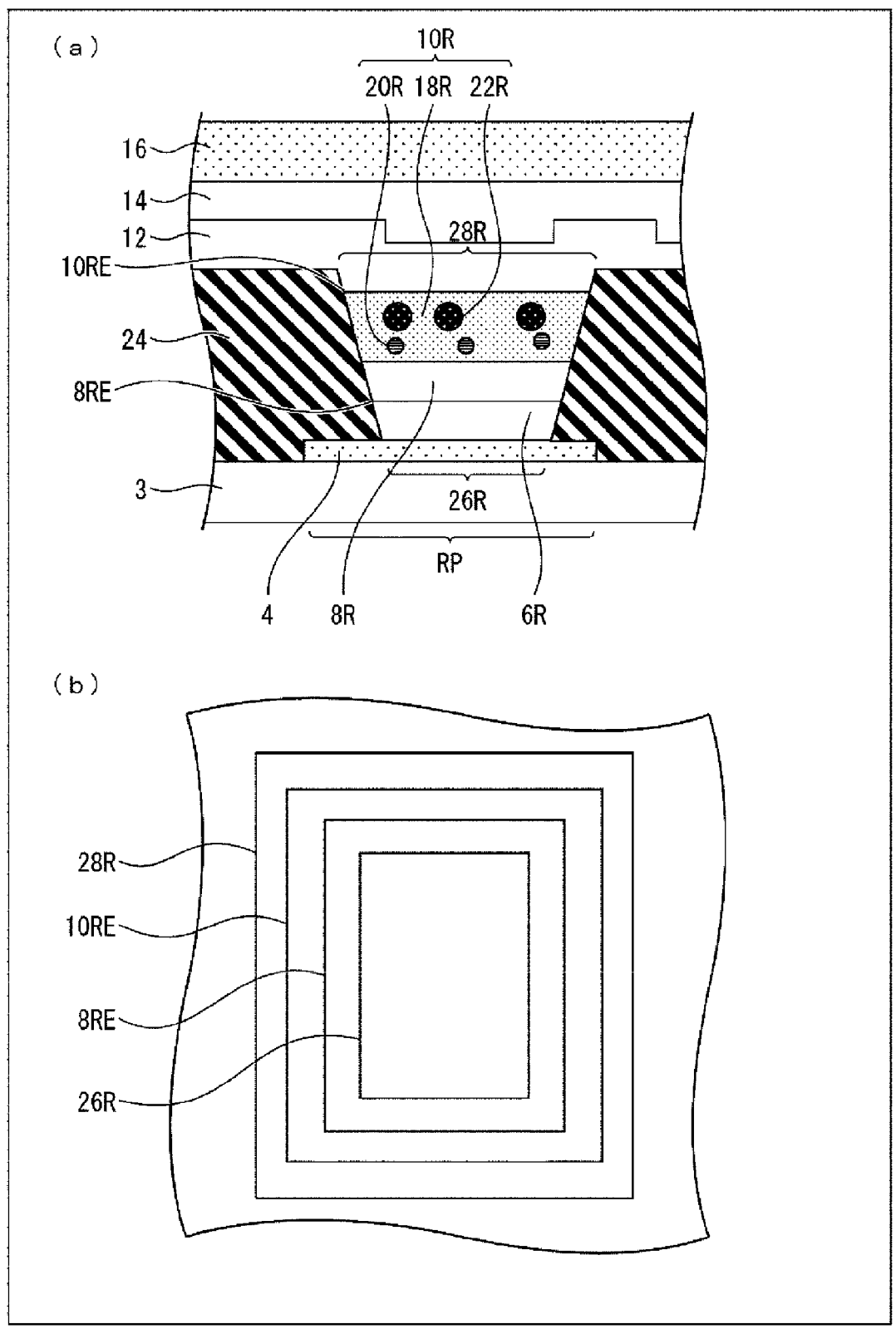
FIG. 4 is a schematic top view illustrating a relationship of positions at which an edge cover and a light-emitting layer are formed in the light-emitting device according to the second embodiment of the present invention.

FIG. 4 is a diagram illustrating a relationship of formation positions of the edge cover and the light-emitting layer of the light-emitting device 2 according to the present embodiment, fa) of FIG. 4 is an enlarged side cross-sectional view of the pixel area RP in FIG. 3. (b) of FIG. 4 is a top view illustrating formation positions of an opening of the edge cover and the light-emitting layer in the pixel area RP.

As illustrated in (a) of FIG. 4, the edge cover 24 includes an opening 26R and an upper end 28R in the pixel area RP. The opening 26R is smaller than the upper end 28R, and the pore of the edge cover 24 extends from the opening 26R up to the upper end 28R with the cross-sectional area of the pore being gradually increased.

Accordingly, as illustrated in (a) and (b) of FIG. 4, a lower end SIZE of the hole transport layer 8R is larger than the opening 26R of the edge cover 24. In other words, the light-emitting layer 10R in an upper layer than the hole transport layer 8R covers the opening 26R of the edge cover 24. The upper end 28R of the edge cover 24 is above the upper end 10RE of the light-emitting layer 10R. In other words, the upper end 28R of the edge cover 24 surrounds the light-emitting layer 10R.

Referring to FIG. 3 again, the light-emitting layer 10R in the pixel area RP includes a host 18R, thermally activated delayed fluorescence bodies 20R, and quantum dots 22R.

Likewise, the light-emitting layer 10G in the pixel area OP includes, a host 18G, thermally activated, delayed fluorescence bodies 20G, and quantum dots 22G, and the light-emitting layer 10B in the pixel area BP includes a host 18B, thermally activated delayed fluorescence bodies 20B, and quantum dots 22B.

In the present embodiment, the light-emitting layers 10R, 10G and 10B in some of the plurality of pixel areas RP, GP and BP includes quantum dots different from the quantum dots of the light-emitting layers 10R, 10G and 10B in other different pixel areas. For example, in the present embodiment, the light-emitting layer 10R in the pixel area RP includes the quantum dots 22R that emit red light as fluorescence. Likewise, the light-emitting layer 10G in the pixel area OP includes the quantum dots 22G that emit green light as fluorescence, and the light-emitting layer 10B in the pixel area BP includes the quantum dots 22B that emit blue light as fluorescence.

Here, the blue light is light having the central wavelength of the light emission in a wavelength band from 400 nm to 500 nm. The green light is light having the central wavelength of the light emission in a wavelength band longer than 500 nm and shorter than or equal to 600 nm. The red light is light having the central wavelength of the light emission in a wavelength band longer than 600 nm and shorter than or equal to 780 nm. The wavelength of fluorescence from the quantum dots can be varied, for example, by designing the radius of the core/shell structure of the quantum dots.

The light-emitting layers 10R, 10G and 10B in some of the plurality of pixel areas RP, GP and BP may have a host or thermally activated delayed fluorescence bodies different from the host or the thermally activated delayed fluorescence bodies of the light-emitting layers 10R, 10G and 10B in other different pixel areas. However, in the present embodiment, the hosts 18R, 18G and 18B and the thermally activated delayed fluorescence bodies 20R, 20G, and 20B in each of the pixel areas may include the same member.

Figure 5:
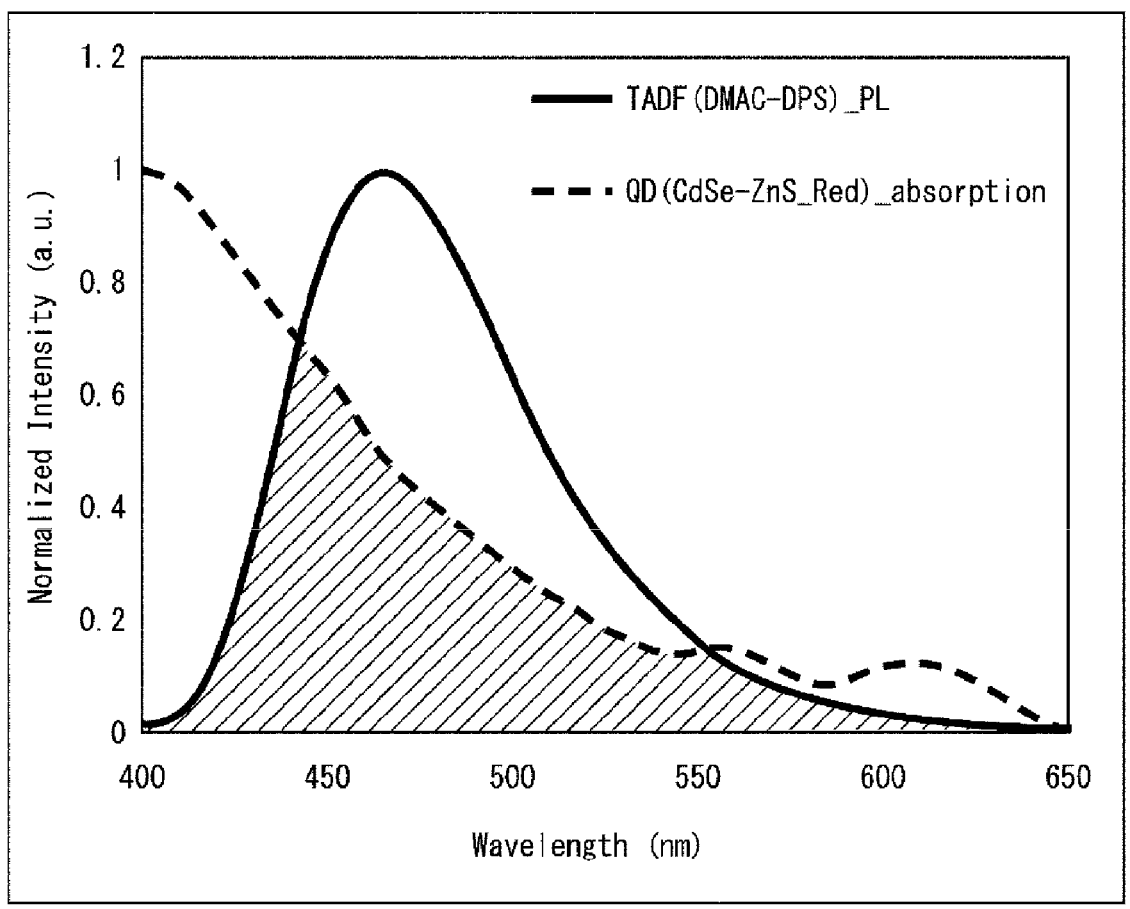
FIG. 5 is a diagram illustrating examples of a light emission spectrum of thermally activated delayed fluorescence bodies and an absorption spectrum of quantum dots in a red pixel area of the light-emitting device according to the second embodiment of the present invention.
Figure 6:
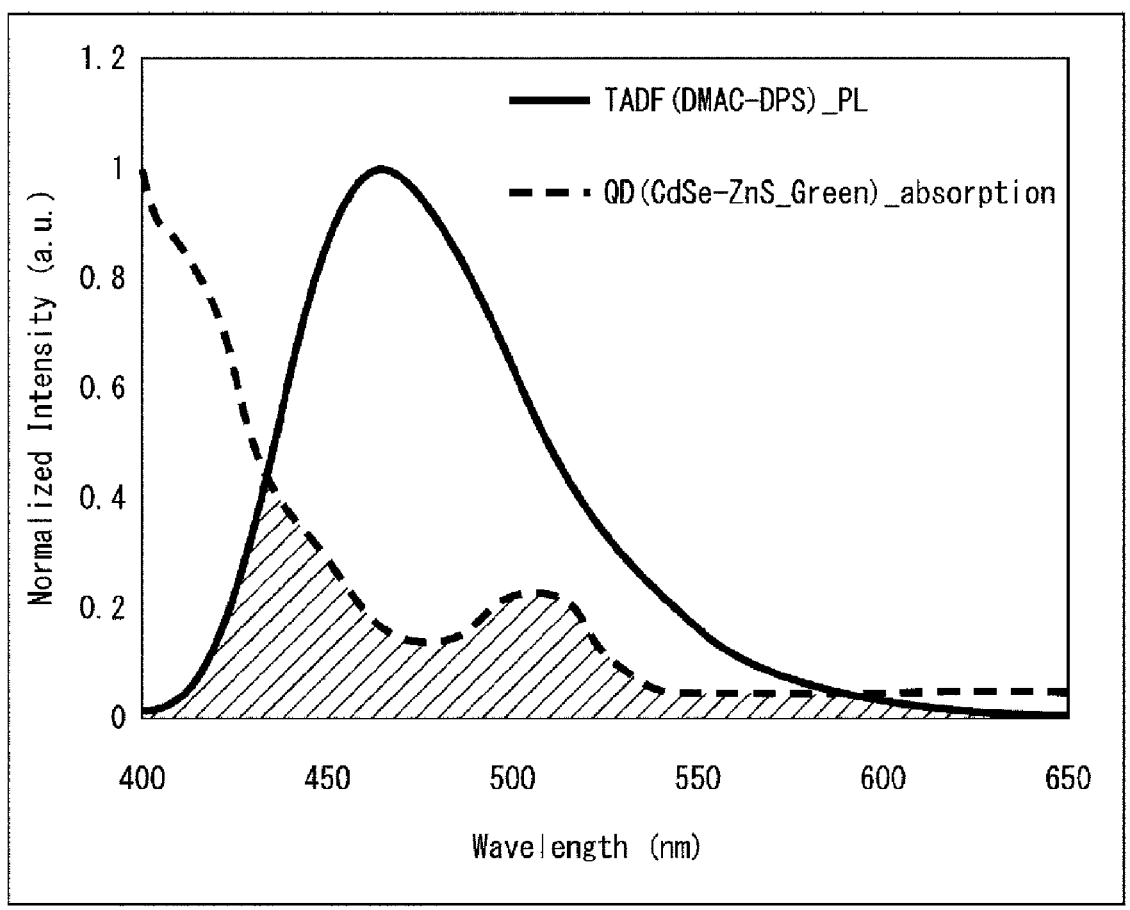
FIG. 6 is a diagram illustrating examples of a light emission spectrum of thermally activated delayed fluorescence bodies and an absorption spectrum of quantum dots in a green pixel area of the light-emitting device according to the second embodiment of the present invention.
Figure 7:
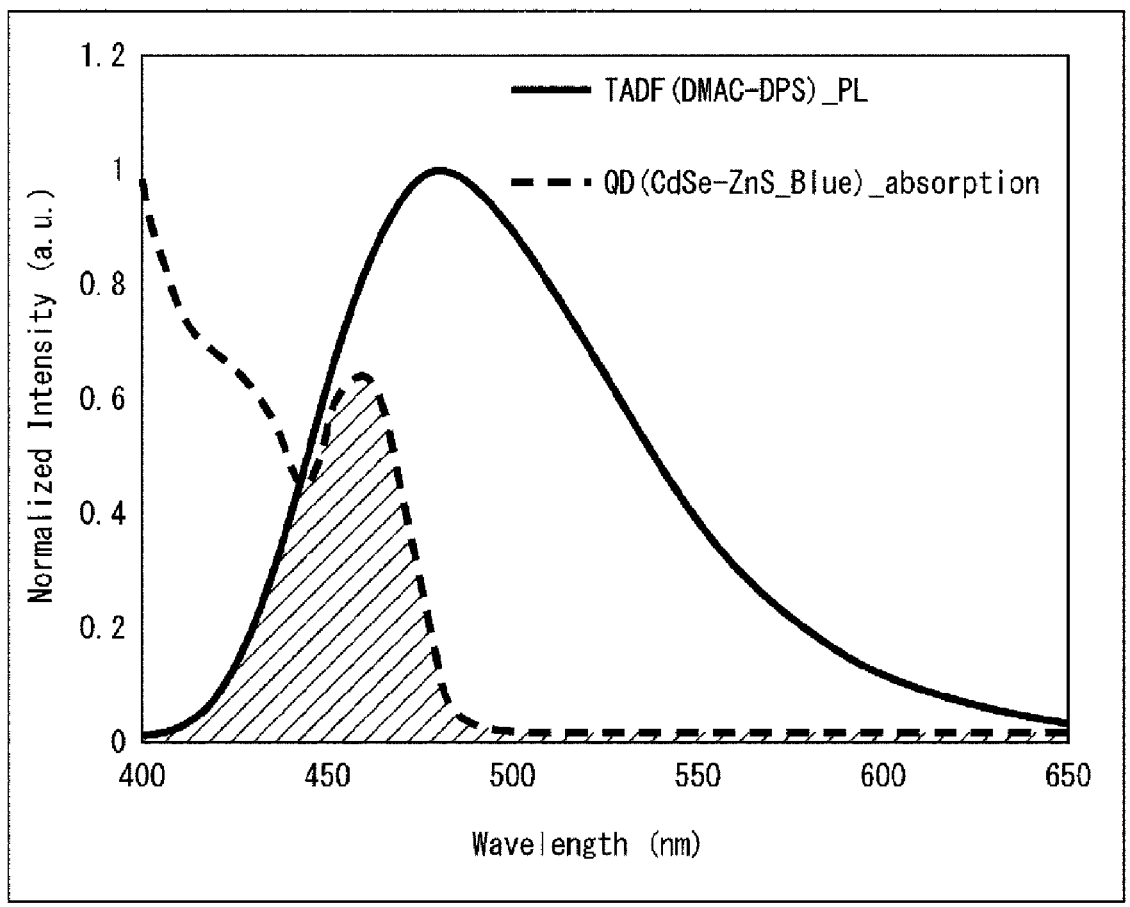
FIG. 7 is a diagram illustrating examples of a light emission spectrum of thermally activated delayed fluorescence bodies and an absorption spectrum of quantum dots in a blue pixel area of the light-emitting device according to the second embodiment of the present invention.

FIG. 5 is a spectrum graph in which an example of the fluorescence spectrum of the thermally activated delayed fluorescence bodies 20R is indicated by a solid line and an example of the absorption spectrum of the quantum dots 22R is indicated by a broken line. FIG. 6 is a spectrum graph in which an example of the fluorescence spectrum of the thermally activated delayed fluorescence bodies 20G is indicated by a solid line and an example of the absorption spectrum of the quantum dots 22G is indicated by a broken line, FIG. 7 is a spectrum graph in which an example of the fluorescence spectrum of the thermally activated delayed fluorescence bodies 20B is indicated by a solid line and an example of the absorption spectrum of the quantum dots 22B is indicated by a broken line. The hatched area in FIGS. 5 to 7 indicates an area where the fluorescence spectrum of each of the thermally activated delayed fluorescence bodies and the absorption spectrum of each of the quantum dots overlap. The spectrums in FIGS. 5 to 6 are normalized with respect to the maximum intensity set to 1.

In the present embodiment, the quantum dots 22R are CdSe—ZnS quantum dots with the light emission peak of 622 nm, manufactured by Mesolight LLC. The quantum dots 22G are CdSe—ZnS quantum dots with the light emission peak of 520 nm, manufactured by Mesolight LLC. The quantum dots 22B are CdS—ZnS quantum dots with the light emission peak of 460 nm, manufactured by Mesolight LLC.

As illustrated in FIGS. 5 to 7, regarding the thermally activated delayed fluorescence bodies and the quantum dots included in the same pixel area, the light emission spectrum of the thermally activated delayed fluorescence bodies and the absorption spectrum of the quantum dots at least partially overlap. With this configuration, the light-emitting device 2 according to the present embodiment emits fluorescence by using a light emission mechanism similar to that of the light-emitting device 2 according to the preceding embodiment, Therefore, similar in the previous embodiment, it is possible to provide a light-emitting device 2 that can obtain fluorescence having a narrow spectrum more efficiently.

The wavelengths of the fluorescence from the quantum dots in the pixel areas are different from each other, and therefore, by controlling the TFTs to control the light emission from the quantum dots in the pixel areas, the light-emitting device 2 capable of performing multi-color display can be provided.

Figure 8:
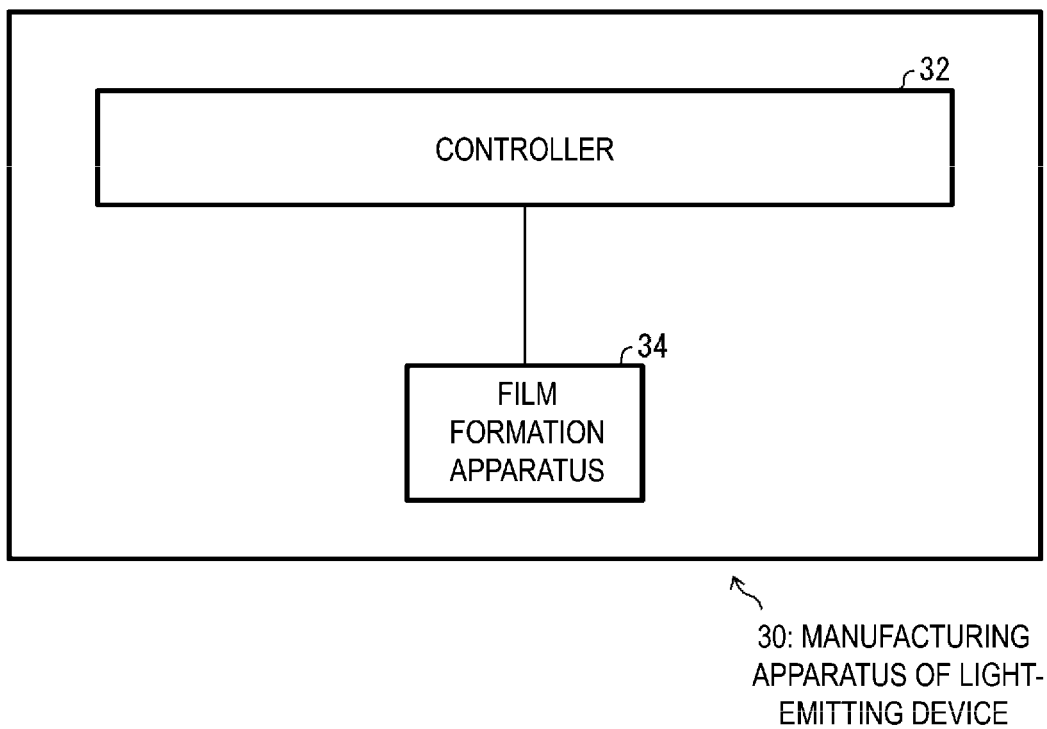
FIG. 8 is a block diagram illustrating a manufacturing apparatus of the light-emitting device according to the embodiments of the present invention.

FIG. 8 is a block diagram illustrating a manufacturing apparatus 30 of the light-emitting device according to the embodiments. The manufacturing apparatus 30 of the light-emitting device may include a controller 32 and a film formation apparatus 34. The controller 32 may control the film formation apparatus 34. The film formation apparatus 34 may form each layer of the light-emitting device 2.

Supplement

A light-emitting device according to a first aspect includes: a light-emitting layer in which thermally activated delayed fluorescence bodies and quantum dots are dispersed; a first electrode in a lower layer than the light-emitting layer; and a second electrode in an upper layer than the light-emitting layer, wherein a light emission spectrum of the thermally activated delayed fluorescence bodies and an absorption spectrum of the quantum dots at least partially overlap each other.

In a second aspect, an exciton generated in the quantum dots transitions, through a resonance phenomenon of a dipole vibration, to an excitation level of the quantum dots, and the quantum dots emit light.

In a third aspect, a peak wavelength of a light emission spectrum of the thermally activated delayed fluorescence bodies is shorter than a peak wavelength of a light emission spectrum of the quantum dots.

In a fourth aspect, a peak wavelength of a light emission spectrum of the thermally activated delayed fluorescence bodies is included in an absorption spectrum of the quantum dots.

In a fifth aspect, a peak wavelength of an absorption spectrum of the quantum dots is included in a light emission spectrum of the thermally activated delayed fluorescence bodies.

In a sixth aspect, a concentration of the thermally activated delayed fluorescence bodies in the light-emitting layer is from 10 mass % to 30 mass %.

In a seventh aspect, a concentration of the quantum dots in the light-emitting layer is from 0.1 mass % to 1 mass %.

In an eighth aspect, an edge cover is provided, the edge cover including a plurality of openings, the edge cover being configured to define the light-emitting layer into a plurality of pixel areas, and for the plurality of openings, the light-emitting layer covers each of the plurality of openings, and an upper end of the edge cover surrounds the light-emitting layer.

In a ninth aspect, the light-emitting layer includes a photosensitive material, and the thermally activated delayed fluorescence bodies and the quantum dots are dispersed in the photosensitive material.

A manufacturing apparatus of a light-emitting device according to a tenth aspect includes a film formation apparatus configured to form a light-emitting layer in which thermally activated delayed fluorescence bodies and quantum dots are dispersed, an absorption spectrum of the quantum dots at least partially overlapping with a light emission spectrum of the thermally activated delayed fluorescence bodies; a first electrode in a lower layer than the light-emitting layer; and a second electrode in an upper layer than the light-emitting layer.

The present invention is not limited to each of the embodiments described above, and various modifications may be made within the scope of the claims. Embodiments obtained by appropriately combining technical approaches disclosed in each of the different embodiments also fall within the technical scope of the present invention. Moreover, novel technical features can be formed by combining the technical approaches disclosed in the embodiments.

REFERENCE SIGNS LIST

2 Light-emitting device
4 First electrode
10 Light-emitting layer
16 Second electrode
18 Host
20 Thermally activated delayed fluorescence body
22 Quantum dot

The invention claimed is:

1. A light-emitting device comprising:
a light-emitting layer in which thermally activated delayed fluorescence bodies and quantum dots are dispersed in a host;
a first electrode in a layer below the light-emitting layer; and
a second electrode in a layer above the light-emitting layer,
wherein a light emission spectrum of the thermally activated delayed fluorescence bodies and an absorption spectrum of the quantum dots at least partially overlap each other,
the host includes: a dispersing material; and a compound having a function of injecting and transporting holes and electrons, and
an intermolecular distance between the thermally activated delayed fluorescence bodies and the quantum dots is smaller than a distance over which energy is transferred from the thermally activated delayed fluorescence bodies to the quantum dots.

2. The light-emitting device according to claim 1, wherein an exciton generated in the thermally activated delayed fluorescence bodies transitions, through a resonance phenomenon of a dipole vibration, to a conduction band level of the quantum dots, and the quantum dots emit light.

3. The light-emitting device according to claim 1, wherein a peak wavelength of the light emission spectrum of the thermally activated delayed fluorescence bodies is shorter than a peak wavelength of a light emission spectrum of the quantum dots.

4. The light-emitting device according to claim 1, wherein a peak wavelength of the light emission spectrum of the thermally activated delayed fluorescence bodies is included in the absorption spectrum of the quantum dots.

5. The light-emitting device according to claim 1, wherein a peak wavelength of the absorption spectrum of the quantum dots is included in the light emission spectrum of the thermally activated delayed fluorescence bodies.

6. The light-emitting device according to claim 1, wherein a concentration of the thermally activated delayed fluorescence bodies in the light-emitting layer is from 10 mass % to 30 mass %.

7. The light-emitting device according to claim 1, wherein a concentration of the quantum dots in the light-emitting layer is from 0.1 mass % to 1 mass %.

8. The light-emitting device according to claim 1, wherein an edge cover is provided, the edge cover including a plurality of openings, the edge cover being configured to define the light-emitting layer into a plurality of pixel areas, and for each of the plurality of openings, the light-emitting layer covers the plurality of openings, and an upper end of the edge cover surrounds the light-emitting layer.

9. The light-emitting device according to claim 1, wherein the light-emitting layer includes a photosensitive material, and the thermally activated delayed fluorescence bodies and the quantum dots are dispersed in the photosensitive material.

10. A manufacturing apparatus of a light-emitting device, the manufacturing apparatus comprising
a film formation apparatus configured to form:
a light-emitting layer in which thermally activated delayed fluorescence bodies and quantum dots are dispersed in a host, an absorption spectrum of the quantum dots at least partially overlapping with a light emission spectrum of the thermally activated delayed fluorescence bodies;
a first electrode in a layer below the light-emitting layer; and
a second electrode in a layer above the light-emitting layer,
wherein the host includes: a dispersing material; and a compound having a function of injecting and transporting holes and electrons, and
an intermolecular distance between the thermally activated delayed fluorescence bodies and the quantum dots is smaller than a distance over which energy is transferred from the thermally activated delayed fluorescence bodies to the quantum dots.

* * * * *